United States Patent [19]

Albertinetti et al.

[11] 4,257,686
[45] Mar. 24, 1981

[54] MULTIPLE LAYER PIEZOELECTRIC WAVEFRONT MODULATOR

[75] Inventors: Nedo P. Albertinetti, Canton; Ralph E. Aldrich, Acton, both of Mass.

[73] Assignee: Itek Corporation, Lexington, Mass.

[21] Appl. No.: 970,055

[22] Filed: Dec. 14, 1978

[51] Int. Cl.³ .............................................. G02F 1/00
[52] U.S. Cl. .................................................... 350/360
[58] Field of Search ................................. 350/360, 6.6

[56] References Cited

U.S. PATENT DOCUMENTS 3,742,234  6/1973  Laakmann ............................. 350/6.6

Primary Examiner—William L. Sikes

Attorney, Agent, or Firm—Homer O. Blair; Robert L. Nathans; Gerald H. Glanzman

[57] ABSTRACT

A wavefront modulator includes a multiple layer unitary block of a piezoelectric medium having a mirror bonded to the uppermost surface of the block. First and second sets of electrodes are formed within the block at each of a plurality of discrete electrically-addressable locations, such that the electrodes of the first set are positioned at one side of each of the layers, and the electrodes of the second set are positioned at opposite sides of each of the layers in order to increase the sensitivity of response of the modulator to in turn decrease the requisite driving or control voltages. The first and second sets of electrodes are offset with respect to each other to provide for ease of electrical access to each electrode of each set.

6 Claims, 2 Drawing Figures

MULTIPLE LAYER PIEZOELECTRIC WAVEFRONT MODULATOR

DESCRIPTION

1. Technical Field

This invention relates to the field of modulating wavefronts of light.

2. Background Art

Early wavefront phase modulators employ a number of discrete drivers, such as electromechanical and piezoelectric transducers. U.S. Pat. No. 3,742,234 to Laakmann discloses various devices of this type. FIGS. 5-7 illustrate stacks of piezoelectric elements, which are deformed by applying various voltages thereto, to in turn, cause deformation of a mirror. The systems constructed in accordance with the teachings of this patent are stable down to only one wavelength of visible light and are incapable of correcting fractions of wavelengths or electromagnetic radiation having shorter wavelengths than those of visible light. Another problem with these devices is that the elements in each stack are formed from various stacks of materials having parameters which vary with respect to each other. For example, the ages of the materials from stack to stack may vary so that the response characteristics of the various transducers will vary with respect to each other. This disadvantage interferes with matching the response characteristics or inflection functions of a particular mirror with those of other mirrors in a system. In contrast, the Feinleib et. al. U.S. Pat. No. 3,904,274, incorporated by reference herein, teaches monolithic devices, which are far simpler to fabricate and are far more stable. Additionally, they have uniformity of the piezoelectric coefficient from point to point, since the material is formed from one wafer. Their stability produces far more accurate control, in contrast with the discrete actuators of the '234 patent. The sensitivity of the Feinleib devices was found to be in the neighborhood of two to three angstroms per volt, and it is an object of the present invention to preserve the advantages of the monolithic structures of Feinleib mentioned hereinabove, and yet, advantageously sharply increase sensitivity.

It is a principal object of the present invention to provide a wavefront modulator having driver amplifiers associated with each discretely-addressable location which apply voltages of typically 400-500 volts to achieve comparable degrees of deformation produced in the Feinleib devices, which required 2,500-3,000 volts. The application of voltages of 2,500-3,000 volts require sophisticated and hence costly driver amplifiers, whereas simple and readily-available amplifiers may be employed to apply the lower voltages in the 400-500 volt range. This new result is obtainable as considerably higher sensitivities are produced in accordance with the present invention, e.g. 27 angstroms per volt.

DISCLOSURE OF THE INVENTION

Summary of the Invention

The above objects have been obtained by providing first and second sets of electrodes at each discretely-addressable location, which sets are positioned on opposite sides of each layer of a multiple layer unitary block of material, wherein each layer has uniform piezoelectric properties throughout, and wherein the first set of electrodes are electrically coupled together to provide one input terminal and the second set of electrodes are electrically coupled together to provide another input terminal at each discretely-addressable location. The result is that each resulting actuator within the unitary block, bonded to the mirror, is composed of several layers to enable sharply lower voltage requirements set forth above. Also, the first and second sets of electrodes are laterally offset with respect to each other to provide for ease of electrical access thereto. Each layer is internally polarized in an opposite direction with respect to the next adjacent layer.

Detailed Description

In FIG. 1, the unitary block of piezoelectric material 1 consists of layers 2, 3, 4, and 6 bonded to each other, together with mirror means 7 bonded to major portions of the upper most surface of layer 6. A first set of electrodes, including electrodes 8, 9, and 10 are electrically coupled together by a first conductor 11, and a second set of electrodes, including electrodes 12 and 13, are electrically coupled together by a second conductor 14. As illustrated, the first and second sets of electrodes are positioned at opposite sides of associated layers so that when the control or driving voltages are applied to the first and second conductors, electric fields will be induced within each layer.

The first set of electrodes is laterally offset with respect to the second set of electrodes, as shown, to provide for ease of electrical access to each electrode of each set. The plan view of FIG. 2 further illustrates this positioning arrangement. A left-hand portion of electrode 9 is illustrated at 16 in FIG. 2, whereas a right-hand portion of electrode 12 is illustrated at 17 in FIG. 2. The overlapping electrode portion 18 and conductors 11 and 14 are also illustrated.

In one embodiment of the invention, the layers were fabricated of lead zirconate titanate (PZT) material and had thicknesses of 1.5 millimeters and the layers were bonded together to form the requisite unitary block of piezoelectric material, which is an essential condition of the practice of this invention. The electrodes were formed on each layer by firing on a silver loaded glass which is etched or machined to produce the desired patterns and the electrodes of each set were coupled together by attaching the conductors to the electrodes by means of conductive epoxy strips. Mirror means 7 was made of glass having a metallic upper surface to provide for the reflection of light. The entire thickness of one embodiment was 2.7 centimeters, and the separation between the addressable locations was a minimum of 1.5 centimeters. The applied voltages to achieve 1 micrometer surface deformation were about 400-500 volts, in sharp contrast with the considerably higher voltages required in the prior art monolithic systems. A back plate, 1.3 centimeters in thickness and made of machinable glass (19), was affixed to layer 2 as shown in FIG. 1, to provide stiffness to the structure. Each layer is internally polarized in an opposite direction with respect to the next adjacent layer as illustrated by the plus and minus signs in FIG. 1.

BEST MODE FOR CARRYING OUT THE INVENTION

Figure 1:
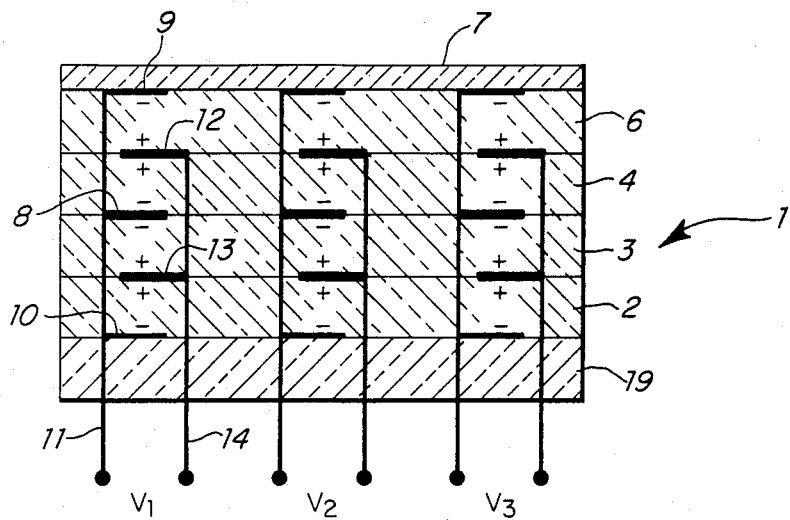
FIG. 1 illustrates a side sectional view of a preferred embodiment of the invention taken along Line 5 of FIG. 2.
Figure 2:
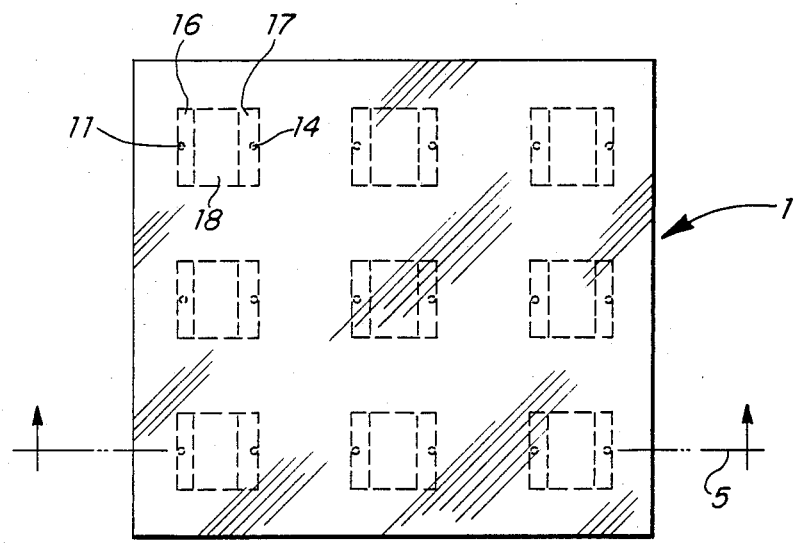
FIG. 2 illustrates a top view of the embodiment of the invention of FIG. 1.

See FIGS. 1 and 2 and the related descriptions. Recently, an embodiment was constructed having a very large number of layers, namely 16 layers of lead zirconate titanate material having thicknesses of 1.5 millimeters. The applied voltages were in the neighborhood of 400 volts, and the separation between each electrically-addressable location was 2 centimeters. The overlapping area 18, illustrated in FIG. 2, was 1.0 square centimeter.

INDUSTRIAL APPLICABILITY

The invention may be used to correct dynamic distortion in optical images such as those viewed by telescopes through atmospheric turbulence.

It should be understood that other components and configurations may be substituted for those described in order to practice the invention, and the invention is to be limited only by the permissible scope of the following claims. References are made in the claims to the numbered components in the described embodiments, and it should be understood that the claims are not to be restricted to such embodiments, as the numbers employed in the claims are merely exemplary of the nature of the claimed means.

We claim:

1. In a piezoelectric wavefront modulator, comprising:
   a. a unitary block of piezoelectric medium (1) which undergoes dimensional changes in response to electric fields produced therein;
   b. a mirror (7) coupled to said unitary block of piezoelectric medium;
   c. means for providing said piezoelectric medium with a plurality of discretely electrically-addressable locations ($V_1$, $V_2$, $V_3$);
   d. means for addressing each discretely electrically-addressable location with a variable strength voltage (11, 14), the resulting field being sufficient at each location to cause the piezoelectric medium to undergo deformation which is capable of correcting distortion in a wavefront striking said mirror; the improvement wherein:
   e. said unitary block of piezoelectric medium comprises layers of material (2, 3, 4, and 6), each layer having uniform piezoelectric properties throughout, and said means for addressing each discretely electrically-addressable location within said unitary piezoelectric medium further includes:
   e-1. a first set of electrodes (8, 9, and 10) at each of said addressable locations positioned at one side of each of said layers;
   e-2. a second set of electrodes (12, 13) at each of said addressable locations positioned at an opposite side of each of said layers;
   e-3. a first conductor (11) coupled to said first set of electrodes at each location;
   e-4. a second conductor (14) coupled to said second set of electrodes at each said location, thereby to increase the sensitivity, and decrease the requisite driving voltage applied to each of said addressable locations.

2. The combination as set forth in claim 1, wherein said mirror is bonded to major portions of one side of said unitary block of said piezoelectric medium.

3. The combination as set forth in claims 1 or 2, wherein said first and second sets of electrodes are laterally offset with respect to each other to provide ease of electrical access to each set of electrodes.

4. The combination as set forth in claim 3 wherein each layer is internally polarized in an opposite direction with respect to the next adjacent layer.

5. The combination as set forth in claim 2 wherein each layer is internally polarized in an opposite direction with respect to the next adjacent layer.

6. The combination as set forth in claim 1 wherein each layer is internally polarized in an opposite direction with respect to the next adjacent layer.

* * * * *